(12) United States Patent
Kashiwagi et al.

(10) Patent No.: US 7,498,085 B2
(45) Date of Patent: *Mar. 3, 2009

(54) EPOXY/SILICONE MIXED RESIN COMPOSITION AND LIGHT-EMITTING SEMICONDUCTOR DEVICE

(75) Inventors: Tsutomu Kashiwagi, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 347 days.

This patent is subject to a terminal disclaimer.

(21) Appl. No.: 10/990,959

(22) Filed: Nov. 18, 2004

(65) Prior Publication Data

US 2005/0129957 A1    Jun. 16, 2005

(30) Foreign Application Priority Data

Nov. 20, 2003  (JP) .............................. 2003-390482

(51) Int. Cl.
*B32B 9/04*  (2006.01)
(52) U.S. Cl. .................. 428/447; 525/476; 525/477; 525/478; 528/15; 528/16; 528/31; 528/32; 528/92; 428/413
(58) Field of Classification Search ........................ None
See application file for complete search history.

(56) References Cited

U.S. PATENT DOCUMENTS

| | | | | |
|---|---|---|---|---|
| 4,082,719 A | | 4/1978 | Liles et al. | |
| 5,106,933 A | * | 4/1992 | Kobayashi et al. | 528/15 |
| 5,585,445 A | * | 12/1996 | Meguriya et al. | 525/476 |
| 5,872,194 A | * | 2/1999 | Isshiki et al. | 525/476 |
| 6,124,407 A | * | 9/2000 | Lee et al. | 525/478 |
| 6,614,172 B2 | | 9/2003 | Chiu et al. | |
| 2002/0145152 A1 | | 10/2002 | Shimomura | |
| 2002/0190262 A1 | | 12/2002 | Nitta et al. | |
| 2005/0244649 A1 | * | 11/2005 | Kashiwagi et al. | 428/413 |
| 2006/0270808 A1 | * | 11/2006 | Imazawa et al. | 525/476 |

FOREIGN PATENT DOCUMENTS

| | | |
|---|---|---|
| JP | 52-107049 | 9/1977 |
| JP | 7-25987 A | 1/1995 |
| JP | 2001-217467 A | 8/2001 |
| JP | 3241338 B2 | 10/2001 |
| JP | 2002-314139 A | 10/2002 |
| JP | 2002-314143 A | 10/2002 |
| JP | 2002-327126 A | 11/2002 |
| JP | 2002-338833 A | 11/2002 |

* cited by examiner

*Primary Examiner*—Marc S Zimmer
(74) *Attorney, Agent, or Firm*—Birch, Stewart, Kolasch & Birch, LLP

(57) ABSTRACT

An epoxy/silicone mixed resin composition comprising (A') an organosilicon compound containing at least one aliphatic unsaturated monovalent hydrocarbon group and at least one silicon atom-bonded hydroxyl group, (B) an epoxy resin containing at least one epoxy group, (C) an organohydrogenpolysiloxane, (D) a platinum group metal-based catalyst, and (E) an aluminum-based curing catalyst is used to encapsulate a light-emitting semiconductor member. The light-emitting semiconductor device undergoes little discoloration in a heat test, and has a high emission efficiency, a long life and reduced energy consumption.

10 Claims, 2 Drawing Sheets

US 7,498,085 B2

EPOXY/SILICONE MIXED RESIN COMPOSITION AND LIGHT-EMITTING SEMICONDUCTOR DEVICE

CROSS-REFERENCE TO RELATED APPLICATION

This non-provisional application claims priority under 35 U.S.C. §119(a) on Patent Application No. 2003-390482 filed in Japan on Nov. 20, 2003, the entire contents of which are hereby incorporated by reference.

1. Technical Field

This invention relates to epoxy/silicone mixed resin compositions which cure into products free from dust deposition on their surface and having a low elasticity, crack resistance and good adhesion and which are useful as light-emitting semiconductor encapsulants, and light-emitting semiconductor devices encapsulated therewith.

2. Background Art

Traditional light-emitting semiconductor devices such as light-emitting diodes (LED) are lamp-type light-emitting semiconductor devices in which a light-emitting semiconductor member is disposed on a lead electrode and encapsulated with a transparent resin to a cannonball shape as shown in FIG. 3. They are recently replaced by the "surface mount" type as a result of simplification of the mounting technology. Nowadays surface mounting light-emitting semiconductor devices as shown in FIGS. 1 and 2 become the mainstream.

In FIGS. 1 to 3, the device includes a housing 1 made of glass fiber-reinforced epoxy resin, a light-emitting semiconductor member 2, lead electrodes 3 and 4, a die-bonding material 5, gold wires 6, and an embedding/protecting material 7.

While resin compositions are used for the embedment of light-emitting semiconductor members such as LED, it is required that the cured resin compositions be transparent. Then compositions comprising an epoxy resin such as a bisphenol A epoxy resin or alicyclic epoxy resin and an acid anhydride curing agent are generally used (see Japanese Patent No. 3,241,338 corresponding to JP-A 11-274571 and JP-A 7-025987). However, these transparent epoxy resins have drawbacks including poor durability to moisture due to a high percent water absorption, poor durability to light due to a low transmittance of short wavelength light, and coloring due to photo-degradation.

Under the circumstances, resin compositions comprising an organic compound having at least two carbon-to-carbon double bonds (which are reactive with SiH groups) in a molecule, a silicon compound having at least two SiH groups in a molecule, and a hydrosilylating catalyst were proposed for the embedment and protection of optical semiconductor members (see JP-A 2002-327126 and JP-A 2002-338833). Regrettably, such silicone compositions have a drawback that when an attempt is made to improve the crack resistance, the cured composition retains surface tack so that dust readily deposits on the surface to interfere with light transmission.

It was then proposed to use high-hardness silicone resins for the embedment and protection purposes (see JP-A 2002-314139 corresponding to U.S. Pat. No. 6,614,172 and JP-A 2002-314143 corresponding to US 2002-0145152A). The high-hardness silicone resins, however, are less adhesive. In an encased light-emitting semiconductor device comprising a light-emitting member disposed in a ceramic and/or plastic housing, wherein the housing interior is filled with a silicone resin, a problem arises in a thermal shock test between −40° C. and 120° C., that the silicone resin separates from the ceramic or plastic housing.

A molding composition comprising epoxy and silicone components as disclosed in JP-A 52-107049 corresponding to U.S. Pat. No. 4,082,719 appears to overcome the above drawbacks, but suffers from adhesion and discoloration problems.

Another problem arises from the fact that optical crystals of various compound semiconductors used in light-emitting members, such as SiC, GaAs, GaP, GaAsP, GaAlAs, InAlGaP, InGaN, and GaN, have high refractive indices. If the refractive index of embedding/protecting resin is low as in the case of dimethylsilicone resin, light is reflected at the interface between the embedding resin and the optical crystal, resulting in a lower emission efficiency.

It is then proposed to add an antireflective film as a means of enhancing the outcoupling efficiency (see JP-A 2001-217467 corresponding to US 2002-0190262A). The provision of an antireflective film undesirably adds to preparation steps and increases the cost.

SUMMARY OF THE INVENTION

An object of the invention is to provide an epoxy/silicone mixed resin composition which is surface tack-free and has improved adhesion, impact resistance, and light transmittance and is suitable as light-emitting semiconductor encapsulant, and a light-emitting semiconductor device encapsulated therewith having a high emission efficiency.

The inventor has found that an encapsulated light-emitting semiconductor device having a high emission efficiency and improved reliability is obtained by encapsulating a light-emitting semiconductor member with an epoxy/silicone mixed resin composition which comprises (A) an organosilicon compound containing at least one silicon atom-bonded hydroxyl group per molecule, (B) an epoxy resin containing at least one epoxy group per molecule, and (E) an aluminum-based curing catalyst and which cures into a transparent product.

It has also been found that when a light-emitting semiconductor member is encapsulated with an epoxy/silicone mixed resin composition comprising (A') an organosilicon compound containing at least one aliphatic unsaturated monovalent hydrocarbon group and at least one silicon atom-bonded hydroxyl group per molecule, (B) an epoxy resin containing at least one epoxy group per molecule, (C) an organohydrogenpolysiloxane, (D) a platinum group metal-based catalyst, and (E) an aluminum-based curing catalyst, hydrosilylation reaction and epoxy resin's curing reaction take place concurrently to form a cured product which is surface tack-free and has a low elasticity, transparency and adhesion so that the resulting light-emitting semiconductor device exhibits excellent properties.

In a first aspect, the invention provides an epoxy/silicone mixed resin composition comprising as essential components, (A') an organosilicon compound containing at least one aliphatic unsaturated monovalent hydrocarbon group and at least one silicon atom-bonded hydroxyl group per molecule, (B) an epoxy resin containing at least one epoxy group per molecule, (C) an organohydrogenpolysiloxane, (D) a platinum group metal-based catalyst, and (E) an aluminum-based curing catalyst.

In another aspect, the invention provides a light-emitting semiconductor device in which a light-emitting semiconductor member is encapsulated with a transparent cured product of an epoxy/silicone mixed resin composition, the composition comprising as essential components, (A) an organosilicon compound containing at least one silicon atom-bonded hydroxyl group per molecule,
(B) an epoxy resin containing at least one epoxy group per molecule, and
(E) an aluminum-based curing catalyst.

Also contemplated herein is a light-emitting semiconductor device in which a light-emitting semiconductor member is encapsulated with a transparent cured product of an epoxy/silicone mixed resin composition comprising components (A'), (B), (C), (D) and (E) as essential components.

Since the mixed resin composition of the invention experiences minimal discoloration in a heat test, the light-emitting semiconductor device encapsulated therewith has the benefits of a high emission efficiency, a long life, and reduced energy consumption. The invention is thus of great worth in the industry.

As used herein, the term "encapsulation" refers to embedding, sealing, coating and protecting functions and is interchangeable therewith.

DESCRIPTION OF THE PREFERRED EMBODIMENT

Figure 1:
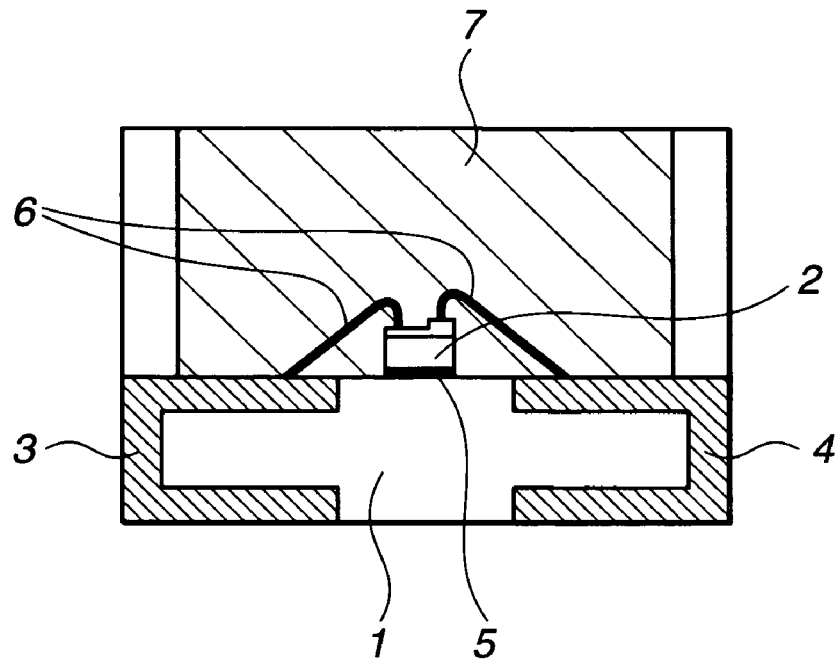
FIG. 1 is a schematic cross section of an exemplary surface mounting light-emitting semiconductor device in which a light-emitting member is die-bonded to an insulating housing.

The material for embedding and protecting a light emitting semiconductor member according to the invention is an epoxy/silicone mixed resin composition comprising (A) an organosilicon compound containing at least one silicon atom-bonded hydroxyl group per molecule, (B) an epoxy resin containing at least one epoxy group per molecule, and (E) an aluminum-based curing catalyst, the composition curing into a transparent product; and specifically, an epoxy/silicone mixed resin composition comprising (A') an organosilicon compound containing at least one aliphatic unsaturated monovalent hydrocarbon group and at least one silicon atom-bonded hydroxyl group per molecule, (B) an epoxy resin containing at least one epoxy group per molecule, (C) an organohydrogenpolysiloxane, (D) a platinum group metal-based catalyst, and (E) an aluminum-based curing catalyst, wherein hydrosilylation reaction and epoxy resin's curing reaction will take place concurrently.

(A) Organosilicon Compound

Component (A) or (A') is an organosilicon compound containing at least one silicon atom-bonded hydroxyl group (i.e., silanol group) per molecule. Included are organosilanes, organosiloxanes, organosilalkylenes, and organosilarylenes. Specifically for the organosilanes and organosiloxanes, use may be made of those having the general compositional formula (1):

$$R^1_a R^2_b (OH)_c (R^3O)_d SiO_{(4-a-b-c-d)/2} \quad (1)$$

wherein $R^1$ is each independently a substituted or unsubstituted monovalent hydrocarbon group having aliphatic unsaturation, $R^2$ is each independently a substituted or unsubstituted monovalent hydrocarbon group free of aliphatic unsaturation, $R^3$ is each independently a substituted or unsubstituted monovalent hydrocarbon group free of aliphatic unsaturation, c is a positive number, a, b and d each are 0 or a positive number. In the case of (A'), a>0. When component (A) or (A') is an organosilane, c is a positive integer, and a, b and d each are 0 or a positive integer, and a+b+c+d=4. When component (A) or (A') is an organopolysiloxane, a+b+c+d<4. It is preferred that $R^1$, $R^2$ and $R^3$ groups have 1 to 10 carbon atoms, especially 1 to 6 carbon atoms.

Typical examples of $R^1$ include, but are not limited to, alkenyl groups such as vinyl, allyl, propenyl, isopropenyl and butenyl, acryloxy and methacryloxy. Typical examples of $R^2$ include, but are not limited to, alkyl groups such as methyl, ethyl, propyl, butyl and cyclohexyl, aryl groups such as phenyl and tolyl, and aralkyl groups such as benzyl. Typical examples of $R^3$ include, but are not limited to, alkyl groups such as methyl, ethyl, propyl and butyl, and aryl groups such as phenyl.

Typical, non-limiting examples of hydroxyl-containing organosilanes include triphenylsilanol, diphenylmethylsilanol, diphenylsilane diol, tetramethyl-dihydroxydisiloxane, and vinyldiphenylsilane diol.

Silanol group-bearing organosilanes and organosiloxanes containing a hydrolyzable group such as alkoxy group can be prepared by hydrolysis or partial hydrolysis of hydrolyzable silanes. Typical silanes include $CH_3(CH_3O)C_6H_5SiOH$, $CH_3(C_2H_5O)C_6H_5SiOH$, $(CH_2=CH)(CH_3O)C_6H_5SiOH$, $C_6H_5(CH_3O)Si(OH)OSi(OH)(CH_3O)C_6H_5$, etc.

The organopolysiloxanes may include siloxane units selected from among $(CH_3)_2(OH)SiO_{1/2}$, $(CH_3)_2SiO$, $CH_3(C_6H_5)(OH)SiO_{1/2}$, $CH_3SiO_{3/2}$, $CH_3(C_6H_5)SiO$, $C_3H_7(CH_3)SiO$, $(CH_2=CH)(C_6H_5)(OH)SiO_{1/2}$, $C_6H_5(CH_2=CH)(CH_3)SiO_{1/2}$, $(CH_2=CH)(CH_3)SiO$, $C_6H_5(OH)SiO$, $(C_6H_5)_2SiO$, and $C_6H_5(CH_3)_2SiO_{1/2}$ units, and combinations thereof, and even a minor amount of $SiO_2$ units. An organopolysiloxane of this type can be readily prepared by hydrolysis of an organochlorosilane corresponding to a selected siloxane unit, followed by condensation of hydroxyl groups for achieving polymerization with a necessary amount of hydroxyl groups being left behind.

In one embodiment wherein component (A) or (A') is an organopolysiloxane, the subscripts a, b, c and d in formula (1) are preferably $0 \leq a \leq 0.5$, especially $0 \leq a \leq 0.2$ (with the proviso that for component (A'), $0.001 \leq a \leq 0.5$, especially $0.01 \leq a \leq 0.2$); $0 \leq b \leq 2.2$, especially $0.5 \leq b \leq 2$; $0.001 \leq c \leq 0.5$, especially $0.01 \leq c \leq 0.2$; and $0 \leq d \leq 0.5$, especially $0 \leq d \leq 0.2$. The sum of a+b+c+d is preferably $0.8 \leq a+b+c+d \leq 3$, especially $1 \leq a+b+c+d \leq 2.5$.

Illustrative preferred examples of organopolysiloxane are those of the following structural formulae.

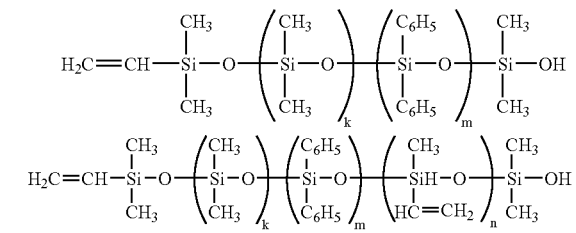

-continued

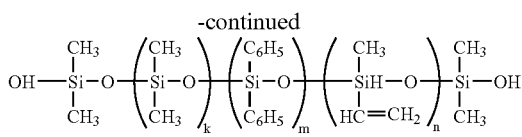

Note that k, m and n are positive numbers, and the sum of k+m+n is such a number that the organopolysiloxane may have a viscosity in the range defined below.

In the embodiment wherein component (A) or (A') is an organopolysiloxane, especially when component (A) or (A') is a diorganopolysiloxane of generally linear structure, it preferably has a viscosity of about 10 to 1,000,000 mPa·s, especially about 100 to 100,000 mPa·s, as measured at 25° C. by a viscosity measurement method using a rotary viscometer of BM type. In an embodiment wherein component (A) or (A') is a branched or three-dimensional network structure containing trifunctional siloxane units or tetrafunctional siloxane units ($SiO_2$) in the molecule, it preferably has a weight average molecular weight of about 500 to 100,000, especially about 1,000 to 10,000, as measured gel permeation chromatography (GPC) using polystyrene standards. Throughout the specification, the measurements of viscosity and molecular weight are as defined herein.

As indicated above, organopolysiloxanes containing silicon atom-bonded hydroxyl groups range from liquid to solid. For those organopolysiloxanes having a high degree of polymerization (corresponding to a viscosity of greater than or equal to 1,000 mPa·s or a weight average molecular weight of greater than or equal to 1,000), the content of silicon atom-bonded hydroxyl groups is preferably 0.5 to 15% by weight, more preferably 1.5 to 10% by weight. Organopolysiloxanes with a hydroxyl content of less than 0.5% by weight may be less reactive with epoxy groups whereas some organopolysiloxanes with a hydroxyl content of more than 15% by weight cannot be prepared in a consistent manner. Of these organosilicon compounds, those having aliphatic unsaturated hydrocarbon groups, typically alkenyl groups are used as component (A').

In addition to the organosilanes and organo(poly)siloxanes described above, silanol group-containing organosilalkylene and organosilarylenes (such as organosilethylene and organosilphenylene), and silanol group-containing organosilanes and organopolysiloxanes having silethylene or silphenylene linkages are also useful herein.

(B) Epoxy Resin

Component (B) is an epoxy resin containing on average at least one epoxy group or oxirane ring. Included are bisphenol F epoxy resins, bisphenol A epoxy resins, phenol novolac epoxy resins, cresol novolac epoxy resins, naphthalene epoxy resins, biphenyl epoxy resins, dicyclopentadiene epoxy resins, aralkyl epoxy resins, biphenyl aralkyl epoxy resins, hydrogenated versions of the foregoing epoxy resins in which phenyl groups on the epoxy resins are hydrogenated, and alicyclic epoxy resins. The epoxy resin used is not limited to these as long as at least one epoxy group is included in the molecule. Inter alia, the hydrogenated versions of epoxy resins and alicyclic epoxy resins which are resistant to photodegradation are advantageously used.

The epoxy resin is preferably present in an amount of 5 to 80% by weight based on the overall organic resins, i.e., the total weight of components (A) and (B) or the total weight of components (A'), (B) and (C). With less than 5 wt % of the epoxy resin, the epoxy/silicone mixed resin composition may form a cured product with insufficient strength so that when a light-emitting semiconductor member is encapsulated therewith, there is a likelihood of resin cracking or adhesion failure in a thermal cycling or heat test. More than 80 wt % corresponds to a substantial proportion of epoxy resin, which suggests that when the light-emitting semiconductor member emits UV radiation, the epoxy/silicone mixed resin composition in the cured state can be degraded by the UV radiation. The more preferred range of the epoxy resin is 10 to 50% by weight.

(C) Organohydrogenpolysiloxane

Component (C) is an organohydrogenpolysiloxane which serves as a crosslinking agent for forming a cured product through addition reaction or hydrosilylation of SiH groups in component (C) to aliphatic unsaturated monovalent hydrocarbon groups, typically vinyl groups in component (A'). Preferred is an organohydrogenpolysiloxane represented by the average compositional formula (2):

wherein $R^4$ is each independently a substituted or unsubstituted monovalent hydrocarbon group free of aliphatic unsaturation, m and n are numbers satisfying $0.001 \leq m<2$, $0.7 \leq n \leq 2$, and $0.8 \leq m+n \leq 3$, and having at least two, more preferably at least three silicon atom-bonded hydrogen atoms (i.e., SiH groups) in a molecule.

In formula (2), $R^4$ is each independently a substituted or unsubstituted monovalent hydrocarbon group free of aliphatic unsaturation, preferably having 1 to 10 carbon atoms, especially 1 to 7 carbon atoms, for example, lower alkyl groups such as methyl, aryl groups such as phenyl, and those exemplified above for $R^2$ in formula (1). The subscripts m and n are numbers satisfying $0.001 \leq m<2$, $0.7 \leq n \leq 2$, and $0.8 \leq m+n \leq 3$, preferably $0.05 \leq m \leq 1$, $0.8 \leq n \leq 2$, and $1 \leq m+n \leq 2.7$. The position of silicon atom-bonded hydrogen atom is not critical and may be at an end or midway of the molecule.

Examples of the organohydrogenpolysiloxane include, but are not limited to, both end trimethylsiloxy-capped methylhydrogenpolysiloxane, both end trimethylsiloxy-capped dimethylsiloxane-methylhydrogensiloxane copolymers, both end dimethylhydrogensilyl-capped methylhydrogenpolysiloxane, both end dimethylhydrogensilyl-capped dimethylsiloxane-methylhydrogensiloxane copolymers, tetramethyltetrahydrogencyclotetrasiloxane, pentamethyltrihydrogencyclotetrasiloxane, and tri(dimethylhydrogensiloxane)methylsilane.

Also useful is a compound of the following structure.

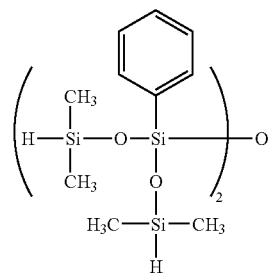

The molecular structure of the organohydrogenpolysiloxane may be either straight, branched, cyclic or network. The organohydrogenpolysiloxane can be obtained by hydrolysis of a chlorosilane such as $R^4SiHCl_2$, $(R^4)_3SiCl$, $(R^4)_2SiCl_2$ or $(R^4)_2SiHCl$ wherein $R^4$ is as defined above, and optionally equilibrating the siloxane resulting from hydrolysis.

The organohydrogenpolysiloxane (C) is compounded in an effective amount to induce curing of component (A'). Preferably component (C) is used in such amounts that the molar ratio of SiH groups to aliphatic unsaturated groups (typically, vinyl) in component (A') is from 0.1 to 4.0, more preferably from 1.0 to 3.0, and even more preferably from 1.2 to 2.8. A molar ratio of less than 0.1 may allow curing reaction to proceed little and make it difficult to produce cured silicone rubber. At a molar ratio in excess of 4.0, a substantial amount of unreacted SiH groups may be left in the cured composition which will change its rubber physical properties with the passage of time.

(D) Platinum Group Metal-based Catalyst

The platinum group metal-based catalyst is compounded for inducing addition cure reaction to the inventive composition. Platinum, palladium and rhodium base catalysts are included. Of these, platinum base catalysts are preferred from the economical standpoint. Specific examples include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, $PtO_2 \cdot mH_2O$, $PtCl_4 \cdot H_2O$, $PtCl_2$, and $H_2PtCl_4 \cdot mH_2O$ wherein m is a positive integer, and complexes thereof with hydrocarbons, alcohols and vinyl-containing organopolysiloxanes. They may be used alone or in admixture. The catalyst (D) may be used in a catalytic amount, specifically in an amount to give about 0.1 to 1,000 ppm, more preferably about 1 to 300 ppm of platinum group metal based on the weight of components (A'), (B) and (C) combined.

(E) Aluminum-based Curing Catalyst

The aluminum-based curing catalyst is to promote polymerization between silanol and epoxy groups. Included are aluminum trihydroxide, and organoaluminum compounds selected from among aluminum alcoholates, aluminum acylates, aluminum acylate salts, aluminosiloxy compounds and aluminum chelates. The catalyst (E) may be used in a catalytic amount, specifically in an amount of about 0.1 to 10% by weight, more preferably about 0.3 to 5% by weight based on the weight of components (A) or components (A') and (B) combined. Less than 0.1 wt % of the catalyst may fail to provide a sufficient curing rate whereas more than 10 wt % may induce too fast cure, failing to provide a desired light-emitting semiconductor device.

In the epoxy/silicone mixed resin composition of the invention, an adhesive aid (F) may be optionally added for improving the adhesion of the cured composition. Suitable adhesive aids are organosilicon compounds such as organosilanes and organopolysiloxanes having silicon atom-bonded alkoxy groups. Examples of the organosilicon compounds include alkoxysilanes such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane as well as siloxane compounds of straight chain or cyclic structure (i.e., organosiloxane oligomers) having about 4 to about 30 silicon atoms, especially about 4 to about 20 silicon atoms and containing in a molecule at least two, preferably two or three functional groups selected from among silicon atom-bonded hydrogen atoms (SiH groups), silicon atom-bonded alkenyl groups (e.g., $Si-CH=CH_2$ groups), alkoxysilyl groups (e.g., trialkoxysilyl groups such as trimethoxysilyl), and epoxy groups (e.g., glycidoxypropyl and 3,4-epoxycyclohexylethyl).

In a preferred embodiment, organoxysilyl-modified isocyanurate compounds having the general formula (3) and/or hydrolytic condensates thereof (i.e., organosiloxane-modified isocyanurate compounds) are used as the adhesive aid (F).

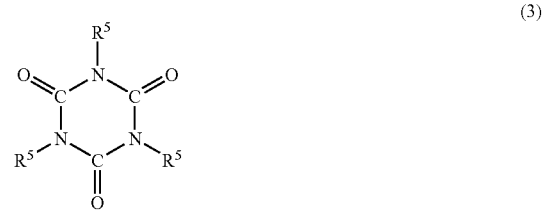

(3)

Herein $R^5$ is an organic group having the formula (4):

(4)

or a monovalent hydrocarbon group containing an aliphatic unsaturated bond, at least one of $R^5$ is an organic group of formula (4), $R^6$ is hydrogen or a monovalent hydrocarbon group of 1 to 6 carbon atoms, and s is an integer of 1 to 6, especially 1 to 4.

Examples of the monovalent hydrocarbon group containing an aliphatic unsaturated bond, represented by $R^5$, include alkenyl groups of 2 to 8 carbon atoms, especially 2 to 6 carbon atoms, such as vinyl, allyl, propenyl, isopropenyl, butenyl, isobutenyl, pentenyl, hexenyl, and cyclohexenyl. The monovalent hydrocarbon groups represented by $R^6$ include those of 1 to 8 carbon atoms, preferably 1 to 6 carbon atoms, for example, alkyl groups such as methyl, ethyl, propyl, isopropyl, butyl, isobutyl, tert-butyl, pentyl, hexyl and cyclohexyl, alkenyl groups such as vinyl, allyl, propenyl and isopropenyl, and aryl groups such as phenyl. Of these, alkyl groups are preferred.

Illustrative examples of the adhesive aid (F) are given below.

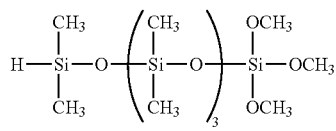

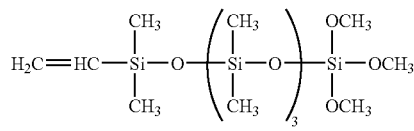

-continued

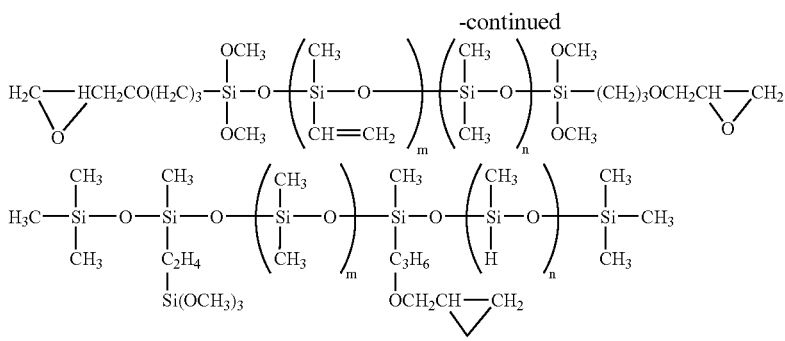

(Subscripts m and n are positive integers satisfying m+n=2 to 50, preferably 4 to 20.)

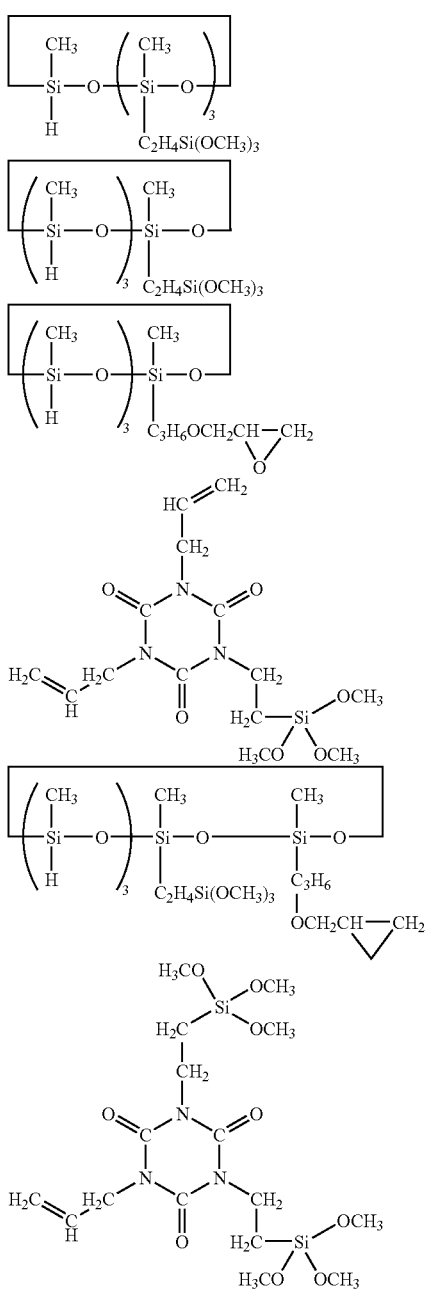

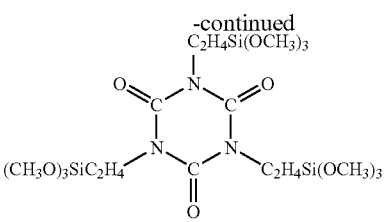

Of the organosilicon compounds, those organosilicon compounds having silicon atom-bonded alkoxy groups and silicon atom-bonded alkenyl groups or silicon atom-bonded hydrogen atoms (i.e., SiH groups) in a molecule are preferred because the cured compositions are more adhesive.

The adhesive aid as optional component (F) is included in an amount of 0 to about 10 parts by weight, preferably about 0.01 to 5 parts by weight, more preferably about 0.1 to 1 part by weight, per 100 parts by weight of component (A) or components (A') and (B) combined. Too less amounts of component (F) may fail to achieve the desired effect whereas too much amounts of component (F) may adversely affect the hardness and surface tack of a cured composition.

By virtue of a high bonding force, the inventive epoxy/silicone mixed resin composition never undergoes separation upon resin curing or IR reflow during mounting operation. Since the cured composition has little or no surface tack, little or no dust deposits on the surface thereof. Since the cured composition has a Durometer Type A hardness of greater than or equal to 70 and low elasticity property, it can absorb the stresses induced by a difference in coefficient of thermal expansion from the ceramic or plastic housing. Then the cured composition develops no cracks even after 1,000 cycles of a thermal shock test between a low temperature of −40° C. and a high temperature of 120° C.

The epoxy/silicone mixed resin composition of the invention can be readily prepared simply by mixing under heat components (A), (B) and (E) or components (A'), (B), (C), (D) and (E). In the latter case, once components (A'), (B), (C), (D) and (E) are combined together, curing takes place even at room temperature. It is then preferable to add minor amounts of reaction inhibitors such as acetylene alcohol compounds, triazoles, nitrile compounds or phosphorus compounds to the composition for extending the pot-life. It is also acceptable to add phosphors for wavelength alteration, light scattering agents such as finely divided titanium oxide (TiO$_2$) or the like to the inventive epoxy/silicone mixed resin composition.

If desired, reinforcing inorganic fillers such as fumed silica and precipitated silica, flame retardance improvers, and organic solvents may be added to the inventive composition as long as they do not compromise the objects of the invention. Similarly, well-known anti-discoloring agents, such as organic phosphorus based anti-discoloring agents may be added.

It is understood that the composition comprising components (A'), (B), (C),.(D) and (E) as essential components and adapted to cure through both condensation of epoxy resin and hydrosilylating addition reaction is preferred to the composition comprising components (A), (B) and (E) as essential components and adapted to cure through only condensation of epoxy resin, because the former is more improved in the adhesion to light-emitting semiconductor members and reliability.

The composition comprising components (A), (B) and (E) or components (A'), (B), (C), (D) and (E) as essential components is used as an embedding/protecting material for the embedment and protection of light-emitting semiconductor members. When the embedding/protecting material is applied by potting or liquid injection, it is preferred that the material be liquid. Specifically, the material has a viscosity at 25° C. of about 10 to 1,000,000 mPa·s, more preferably about 100 to 1,000,000 mPa·s. When a light-emitting semiconductor device is prepared by transfer molding, a liquid resin as described just above may be used, or such a liquid resin may be thickened into a solid state and pelletized prior to transfer molding.

Figure 2:
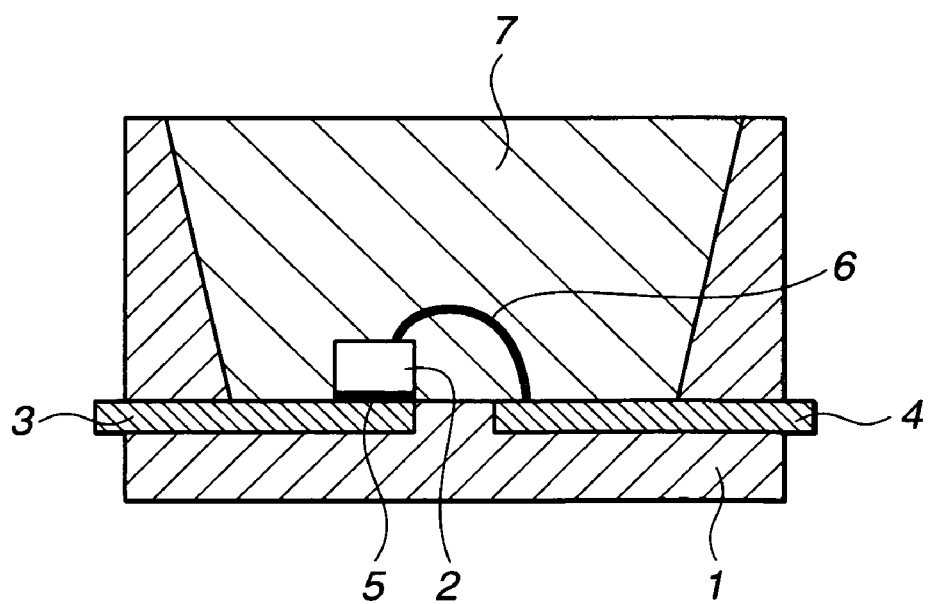
FIG. 2 is a schematic cross section of another exemplary surface mounting light-emitting semiconductor device in which a light-emitting member is die-bonded to lead electrodes inserted through a housing.
Figure 3:
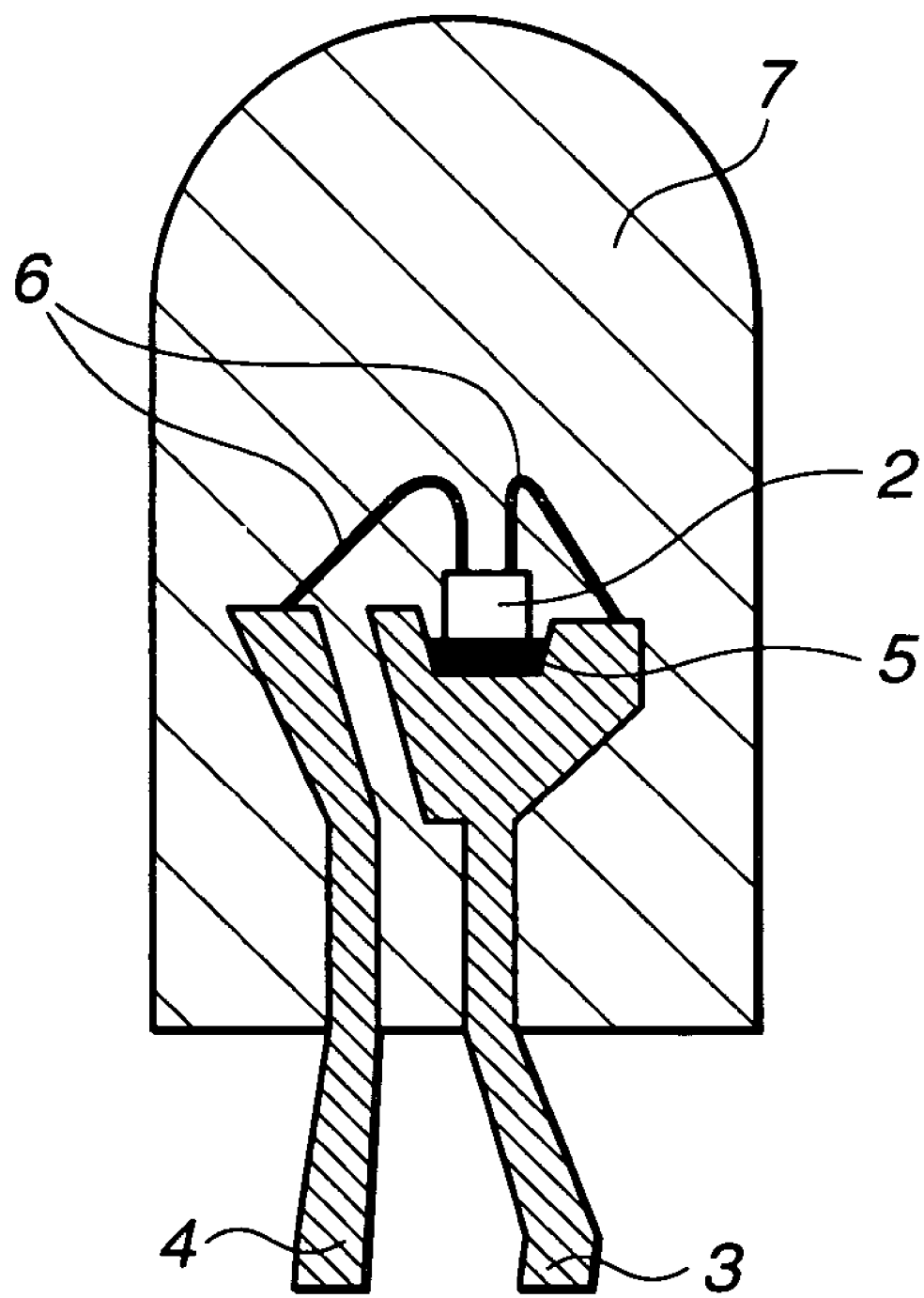
FIG. 3 is a schematic cross section of an LED as a lamp type light-emitting semiconductor device.

The embedding/protecting material of the invention is used for the embedment and protection of light-emitting semiconductor members. The light-emitting semiconductor members to which the invention is applicable include light-emitting diodes (LED), organic electroluminescent devices (organic EL), laser diodes, and LED arrays. It is not critical how to embed light-emitting semiconductor members. In a typical procedure, as shown in FIGS. 1 and 2, a light-emitting semiconductor member 2 is disposed in an open interior of a housing 1, the interior is filled with the embedding/protecting material 7 so as to surround the light-emitting semiconductor member 2, and the material is cured. Also, as shown in FIG. 3, LED mounted on a matrix substrate may be encapsulated by a printing, transfer molding or injection molding process.

For the inventive embedding/protecting material, the curing conditions may be selected from a wide range from about 72 hours at room temperature (25° C.) to about 3 minutes at 200° C. and in accordance with working conditions. An appropriate set of conditions may be determined by taking a balance with productivity and the heat resistance of a light-emitting semiconductor member and a housing. In the event of transfer molding or injection molding, the cured product is obtained simply by molding at a temperature of 150 to 180° C. and a pressure of 20 to 50 kgf/cm² for a time of 1 to 5 minutes.

EXAMPLE

Examples of the invention are given below by way of illustration and not by way of limitation. All parts are by weight. Me is methyl, Vi is vinyl, and Ph is phenyl. The viscosity is a measurement at 25° C.

First described are tests for evaluating embedding/protecting materials of Examples and Comparative Examples.

[Tests]

Preparation of Silicone Base Die-bonding Material

A silicone base die-bonding material was prepared by intimately mixing 100 parts of a vinyldimethylsiloxy-terminated dimethylsiloxane/diphenylsiloxane copolymer (viscosity 3 Pa·s) having formula (I), 2.5 parts of a methylhydrogenpolysiloxane (viscosity 15 mPa·s) having formula (II), 0.03 part of a 2-ethylhexyl alcohol-modified chloroplatinic acid solution (Pt concentration 2 wt %), 0.05 part of ethynylcyclohexyl alcohol, 7 parts of 3-glycidoxypropyltrimethoxysilane, and 400 parts of spherical alumina fine powder having an average particle diameter of 9 µm.

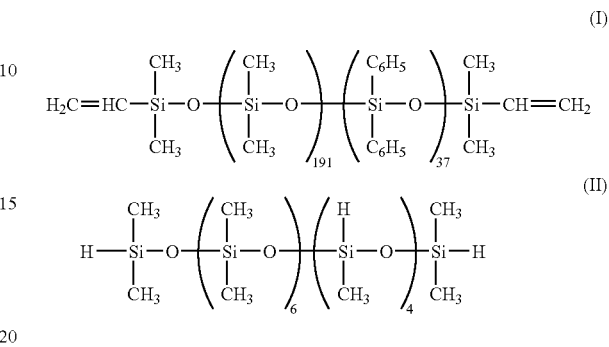

Fabrication of Light-emitting Semiconductor Device

A light-emitting semiconductor device as shown in FIG. 3 was fabricated. An LED chip including an emissive layer of InGaN and having a main emission peak at 470 nm was used as a light-emitting member 2. The light-emitting member 2 was secured to a lead electrode 3 by using the silicone base die-bonding material 5 and heating at 180° C. for 10 minutes. Gold wires 6 were bonded to the light-emitting member 2 and the lead electrodes 3 and 4 for electrical connection. An embedding/protecting material 7 was potted and cured at 180° C. for one hour, completing a light-emitting semiconductor device.

Thermal Shock Test

On the light-emitting semiconductor device fabricated above, a thermal shock test of cooling to −40° C. and heating to 120° C. was performed 1,000 cycles. The outer appearance of samples was inspected for cracks, the number of cracked samples being reported.

Dust Deposition on Surface

Silica powder was sprayed on the light-emitting semiconductor device fabricated above so that silica particles deposited on the surface. Air was blown to the device surface to see whether silica particles were blown off the surface.

Light Transmittance Change

A cured product of each composition was held in an atmosphere at 100° C. for 1,000 hours. The light transmittance of the cured product was determined at the initial and after 1,000 hours of heat aging. A percent retention of transmittance was computed therefrom.

Example 1

An epoxy/silicone mixed resin composition was prepared by combining 50 parts of a polysiloxane having formula (i), 30 parts of an organopolysiloxane having a siloxane unit composition (molar ratio) of $(PhSiO_{3/2})_{0.6}(MeSiO_{3/2})_{0.2}(ViMeSiO_{2/2})_{0.2}$ and containing 8% by weight of silicon atom-bonded hydroxyl groups, 20 parts of a bisphenol A epoxy resin, 5 parts of an organohydrogenpolysiloxane having formula (ii), 0.3 part of an adhesive aid having formula (iii), 0.05 part of an octyl alcohol-modified chloroplatinic acid solution, and 0.1 part of aluminum acetylacetonate and intimately mixing them.

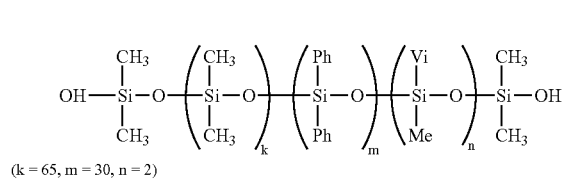

(k = 65, m = 30, n = 2)

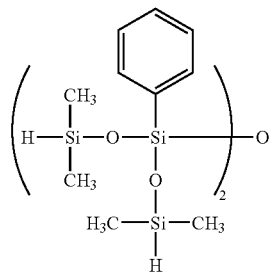

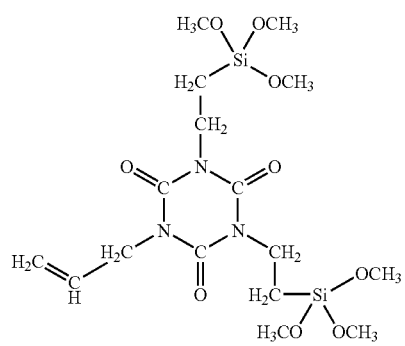

The composition was heat molded at 150° C. for 4 hours to form a cured sample, which was measured for Shore D hardness according to JIS K-6301. The composition which had been cured at 150° C. for 4 hours was colorless and transparent.

Using the resin composition, a light-emitting semiconductor device was fabricated as above.

Example 2

An epoxy/silicone mixed resin composition was prepared by combining 80 parts of an organopolysiloxane having a siloxane unit composition (molar ratio) of $(PhSiO_{3/2})_{0.6}(MeSiO_{3/2})_{0.2}(ViMeSiO2/2)_{0.2}$ and containing 8% by weight of silicon atom-bonded hydroxyl groups, 20 parts of a bisphenol A epoxy resin, 5 parts of an organohydrogenpolysiloxane having formula (ii), 0.3 part of an adhesive aid having formula (iii), 0.05 part of an octyl alcohol-modified chloroplatinic acid solution, and 0.1 part of aluminum acetylacetonate and intimately mixing them.

The composition was heat molded at 150° C. for 4 hours to form a cured sample, which was measured for Shore D hardness according to JIS K-6301. The cured sample was colorless and transparent.

Using the resin composition, a light-emitting semiconductor device was fabricated as above.

Example 3

An epoxy/silicone mixed resin composition was prepared as in Example 1 according to the same formulation, aside from using a hydrogenated bisphenol A epoxy resin (trade name Epolight 4000 by Kyoeisha Chemical Co., Ltd.) instead of the bisphenol A epoxy resin used in Example 2. The composition was similarly cured and examined as in Example 1, with the results shown in Table 1. The cured sample was colorless and transparent. Using the resin composition, a light-emitting semiconductor device was fabricated as above.

Example 4

An epoxy/silicone mixed resin composition was prepared as in Example 1 according to the same formulation, aside from using 0.8 part of aluminum benzoate instead of the aluminum acetylacetonate used in Example 3. The composition was similarly cured and examined as in Example 1, with the results shown in Table 1. The cured sample was colorless and transparent. Using the resin composition, a light-emitting semiconductor device was fabricated as above.

Example 5

An epoxy/silicone mixed resin composition was prepared by combining 70 parts of an organopolysiloxane of $(MeSiO_{3/2})_{0.45}(PhSiO_{3/2})_{0.4}(MePhSiO)_{0.15}$ containing 5% by weight of silicon atom-bonded hydroxyl groups, 30 parts of a hydrogenated bisphenol A epoxy resin (trade name Epolight 4000 by Kyoeisha Chemical Co., Ltd.), 1 part of γ-glycidoxypropyltrimethoxysilane (trade name KBM403 by Shin-Etsu Chemical Co., Ltd.) as a silane coupling agent, and 1.5 part of aluminum benzoate and intimately melt mixing them. The composition was similarly cured. The cured sample was colorless and transparent. Using the resin composition, a light-emitting semiconductor device was fabricated as above.

Comparative Example 1

A commercially available silicone varnish KJR-632 (Shin-Etsu Chemical Co., Ltd.) was similarly cured into a cured sample, which was tested as in Example 1. The results are also shown in Table 1. The cured sample was colorless and transparent. Using the varnish, a light-emitting semiconductor device was fabricated as above.

Comparative Example 2

A liquid epoxy resin composition was prepared by mixing at room temperature 100 parts of a transparent bisphenol A epoxy resin (trade name EP828, Japan Epoxy Co., Ltd.) as an epoxy resin, 100 parts of methyltetrahydrophthalic anhydride (trade name MH700, Shin-Nippon Rika Co., Ltd.) as an acid anhydride, 2 parts of γ-glycidoxypropyltrimethoxysilane (trade name KBM403 by Shin-Etsu Chemical Co., Ltd.), and 1.2 parts of 1,8-diazabicyclo(5,4,0)undecene-7 (DBU) as a curing catalyst. The composition was similarly cured into a cured sample, which was tested as in Example 1. The results are also shown in Table 1. The cured sample was colorless and transparent. Using the resin composition, a light-emitting semiconductor device was fabricated as above.

Using the resin compositions of Examples 1 to 5 and Comparative Examples 1 to 2, light-emitting semiconductor members were encapsulated. Device properties were evaluated.

Table 1 shows the test results of the embedding/protecting materials of Examples and Comparative Examples.

TABLE 1

|  | Example | | | | | Comparative Example | |
|---|---|---|---|---|---|---|---|
|  | 1 | 2 | 3 | 4 | 5 | 1 | 2 |
| Resin hardness (Shore D) | 58 | 87 | 80 | 80 | 80 | 80 | 90 |
| Surface dust deposition | nil | nil | nil | nil | nil | nil | nil |
| Thermal shock test (cracked samples) | 0/50 | 0/50 | 0/50 | 0/50 | 0/50 | 50/50 | 0/50 |
| Light transmittance change @100° C./ 1000 hr (%) | 90 | 90 | 90 | 90 | 90 | 95 | 40 |

Japanese Patent Application No. 2003-390482 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy/silicone mixed resin composition comprising
(A') a combination of an organopolysiloxane having the following general compositional formula (1):

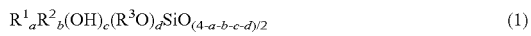

$$R^1_a R^2_b (OH)_c (R^3O)_d SiO_{(4-a-b-c-d)/2} \quad (1)$$

wherein $R^1$ is each independently a substituted or unsubstituted monovalent hydrocarbon group having aliphatic unsaturation, $R^2$ is each independently a substituted or unsubstituted monovalent hydrocarbon group free of aliphatic unsaturation, $R^3$ is each independently a substituted or unsubstituted monovalent hydrocarbon group free of aliphatic unsaturation, $0.001 \leq a \leq 0.5$, $0 \leq b \leq 2.2$, $0.001 \leq c \leq 0.5$ $0 \leq d \leq 0.5$, and $0.8 \leq a+b+c+d \leq 3$, the organopolysiloxane containing $CH_3SiO_{3/2}$ unit and/or $C_6H_5SiO_{3/2}$ unit, and an organopolysiloxane having the following structural formula:

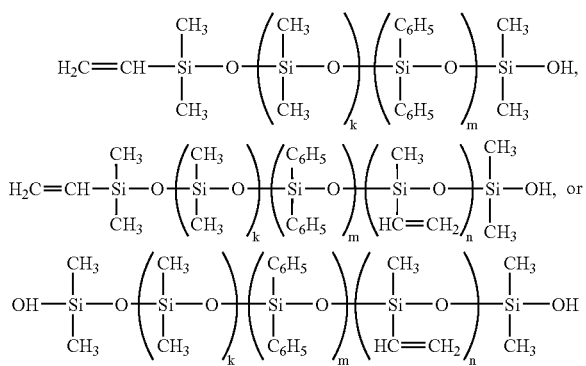

wherein k, m and n are positive numbers, and the sum of k+m+n is such a number that the organopolysiloxane has a viscosity of about 10 to 1,000,000 mPa·s as measured at 25° C. by a viscosity measurement method using a rotary viscometer of BM type, (B) an epoxy resin containing at least one epoxy group per molecule, (C) an organohydrogenpolysiloxane,
(D) a platinum group metal-based catalyst, and
(E) an aluminum-based curing catalyst.

2. An epoxy/silicone mixed resin composition according to claim 1, which further comprises
(F) an adhesive aid selected from the group consisting of alkoxysilanes and siloxane compounds of straight chain or cyclic structure having about 4 to about 30 silicon atoms and containing in a molecule at least two functional groups selected from among silicon atom-bonded hydrogen atoms, silicon atom-bonded alkenyl groups, alkoxysilyl groups, and epoxy groups.

3. An epoxy/silicone mixed resin composition according to claim 1, which further comprises
(F) as an adhesive aid an organoxysilyl-modified isocyanurate compounds having the general formula (3) and/or hydrolytic condensates thereof:

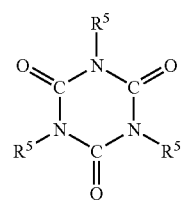

(3)

wherein $R^5$ is an organic group having the formula (4):

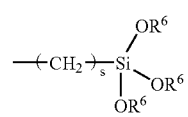

(4)

or a monovalent hydrocarbon group containing an aliphatic unsaturated bond, at least one of $R^5$ is an organic group of formula (4), $R^6$ is hydrogen or a monovalent hydrocarbon group of 1 to 6 carbon atoms, and s is an integer of 1 to 6.

4. A light-emitting semiconductor device in which a light-emitting semiconductor member is encapsulated with a transparent cured product of the epoxy/silicone mixed resin composition of any one of claims 1, 2 or 3.

5. A light-emitting semiconductor device in which a light-emitting semiconductor member is encapsulated with a transparent cured product of an epoxy/silicone mixed resin composition, said composition comprising (A) a combination of an organopolysiloxane having the following general compositional formula (1):

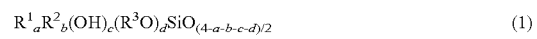

$$R^1_a R^2_b (OH)_c (R^3O)_d SiO_{(4-a-b-c-d)/2} \quad (1)$$

wherein $R^1$ is each independently a substituted or unsubstituted monovalent hydrocarbon group having aliphatic unsaturation, $R^2$ is each independently a substituted or unsubstituted monovalent hydrocarbon group free of aliphatic unsaturation, $R^3$ is each independently a substituted or unsubstituted monovalent hydrocarbon group free of aliphatic unsaturation $0 \leq a \leq 0.5$, $0 \leq b \leq 2.2$ $0.001 \leq c \leq 0.5$, $0 \leq d \leq 0.5$, and $0.8 \leq a+b+c+d \leq 3$, the organopolysiloxane containing $CH_3SiO_{3/2}$ unit and/or $C_6H_5SiO_{3/2}$ unit, and an organopolysiloxane having the following structural formula:

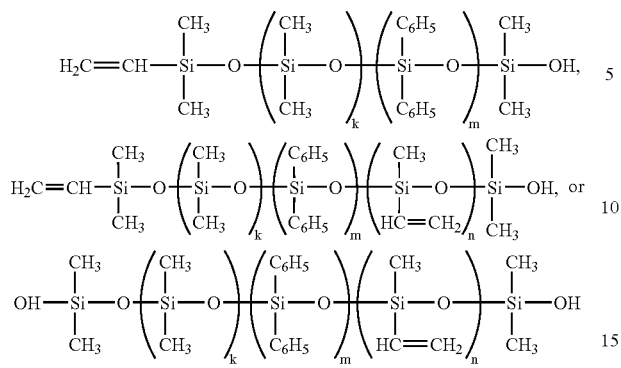

wherein k, m and n are positive numbers, and the sum of k+m+n is such a number that the organopolysiloxane has a viscosity of about 10 to 1,000,000 mPa·s as measured at 25° C. by a viscosity measurement method using a rotary viscometer of BM type, (B) an epoxy resin containing at least one epoxy group per molecule, and (E) an aluminum-based curing catalyst.

6. A light-emitting semiconductor device in which a light-emitting semiconductor member is encapsulated with a transparent cured product of an epoxy/silicone mixed resin composition, said composition comprising (A) at least one selected from the group consisting of organopolysiloxanes having the following structural formulae:

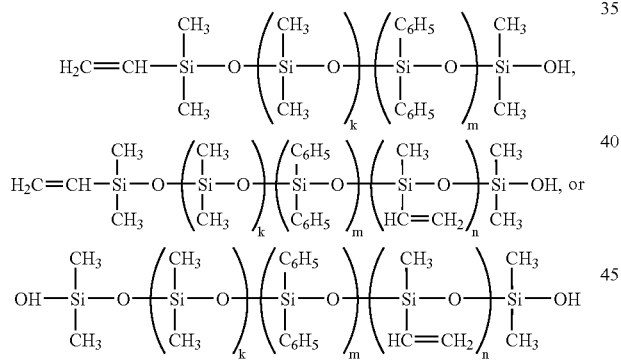

wherein k, m and n are positive numbers, and the sum of k+m+n is such a number that the organopolysiloxane has a viscosity of about 10 to 1,000,000 mPa·s as measured at 25° C. by a viscosity measurement method using a rotary viscometer of BM type, (B) an epoxy resin containing at least one epoxy group per molecule, and (E) an aluminum-based curing catalyst.

7. A light-emitting semiconductor device according to either of claims 5 or 6, which further comprises (F) an adhesive aid selected from the group consisting of alkoxysilanes and siloxane compounds of straight chain or cyclic structure having about 4 to about 30 silicon atoms and containing in a molecule at least two functional groups selected from among silicon atom-bonded hydrogen atoms, silicon atom-bonded alkenyl groups, alkoxysilyl groups, and epoxy groups.

8. A light-emitting semiconductor device according to either of claims 5 or 6, which further comprises (F) as an adhesive aid an organoxysilyl-modified isocyanurate compounds having the general formula (3) and/or hydrolytic condensates thereof:

(3)

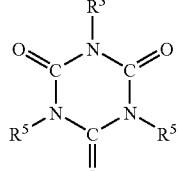

wherein $R^5$ is an organic group having the formula (4):

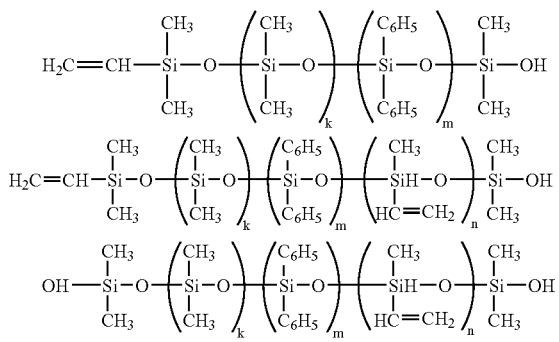

or a monovalent hydrocarbon group containing an aliphatic unsaturated bond, at least one of $R^5$ is an organic group of formula (4), $R^6$ is hydrogen or a monovalent hydrocarbon group of 1 to 6 carbon atoms, and s is an integer of 1 to 6.

9. The epoxy/silicon mixed resin composition comprising (A') an organopolysiloxane having the following general compositional formula (1):

$$R^1_a R^2_b (OH)_c (R^3O)_d SiO_{(4-a-b-c-d)/2} \quad (1)$$

wherein $R^1$ is each independently a substituted or unsubstituted monovalent hydrocarbon group having aliphatic unsaturation, $R^2$ is each independently a substituted or unsubstituted monovalent hydrocarbon group free of aliphatic unsaturation, $R^3$ is each independently a substituted or unsubstituted monovalent hydrocarbon group free of aliphatic unsaturation, $0.001 \leq a \leq 0.5$, $0 \leq b \leq 2.2$, $0.001 \leq c \leq 0.5$, $0 \leq d \leq 0.5$, and $0.8 \leq a+b+c+d \leq 3$, the organopolysiloxane containing $CH_3SiO_{3/2}$ unit and/or $C_6H_5SiO_{3/2}$ unit, (B) an epoxy resin containing at least one epoxy per molecule, (C) tri(dimethylhydrogensiloxane)methylsilane or

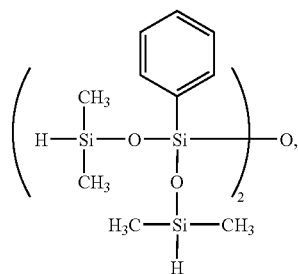

(D) a platinum group metal-based catalyst, and (E) an aluminum-based curing catalyst.

10. A light-emitting semiconductor device in which a light-emitting semiconductor member is encapsulated with a transparent cured product of the epoxy/silicone mixed resin composition comprising (A') at least one selected from the group consisting of organopolysiloxanes having the following structural formulae:

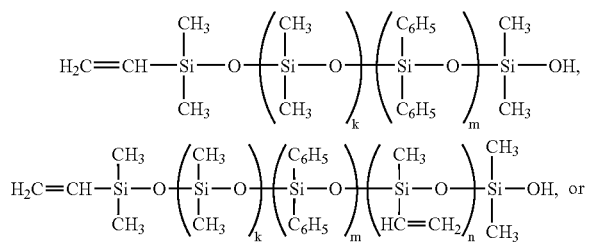

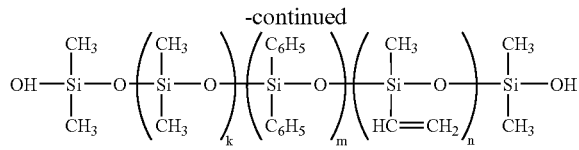

wherein k, m and n are positive numbers, and the sum of k+m+n is such a number that the organopolysiloxane has a viscosity of about 10 to 1,000,000 mPa·s as measured at 25° C. by a viscosity measurement method using a rotary viscometer of BM type, (B) an epoxy resin containing at least one epoxy group per molecule,
(C) an organohydrogenpolysiloxane,
(D) a platinum group metal-based catalyst, and
(E) an aluminum-based curing catalyst.

* * * * *